United States Patent [19]
Walton

[11] 3,831,112

[45] Aug. 20, 1974

[54] VOLTAGE CONTROLLED SWEEP OSCILLATOR

[75] Inventor: Charles A. Walton, Los Gatos, Calif.

[73] Assignee: Proximity Devices, Incorporated, Sunnyvale, Calif.

[22] Filed: Dec. 27, 1972

[21] Appl. No.: 319,038

[52] U.S. Cl. ............. 331/108 B, 331/135, 331/178, 331/179

[51] Int. Cl. ............................................ H03b 5/24

[58] Field of Search ............ 331/108 B, 108 R, 135, 331/45, 136, 137; 332/16 T

[56] References Cited

UNITED STATES PATENTS

| | | | |
|---|---|---|---|
| 2,492,184 | 12/1949 | Royden | 331/45 |
| 2,810,843 | 10/1957 | Granqvist | 331/108 R |
| 3,141,139 | 7/1964 | Mills et al. | 331/45 |
| 3,553,484 | 1/1971 | Gassmann | 331/108 R |

*Primary Examiner*—John Kominski
*Attorney, Agent, or Firm*—Schatzel & Hamrick

[57] ABSTRACT

A sweep oscillator comprising a plurality of individual amplifier-phase shift stages connected in cascade, each of said stages being adapted to amplify an input signal and generate an output signal more than 180° out of phase relative to the input to said stage, the number of amplifier-phase shift stages connected in cascade being adapted such that the phase relationship of the output of the last stage relative to the input of the first stage is a multiple of 360°; terminal means for receiving a variable supply potential to vary the internal impedance of each of said stages responsive to the supply potential; and feedback means for returning an output signal from the last stage of the cascade to the input of the first stage of the cascade.

5 Claims, 6 Drawing Figures

VOLTAGE CONTROLLED SWEEP OSCILLATOR

BACKGROUND OF THE INVENTION

The present invention relates to oscillators and more specifically to voltage controlled sweep oscillators.

Voltage controlled sweep oscillators generate an output signal varying in frequency over a select frequency range. The oscillator repeatedly sweeps through said frequencies within the range responsive to a varying control voltage. Various applications for sweep oscillators include electronic frequency responsive measuring equipment and frequency detection equipment. For example, sweep oscillators may be utilized in electronic key and lock systems wherein the key has a resonant coded frequency and when brought into proximity of a door where a source generates a field of various frequencies, the door is unlatched when the key frequency matches that of the generated field. The source may include voltage controlled sweep oscillator joined to an induction coil to generate said field of varying frequencies.

SUMMARY OF THE PRESENT INVENTION

The present invention provides an electronic sweep oscillator including a plurality of individual amplifier-phase shift stages joined in cascade with positive feedback from the output of the last stage to the input of the first stage. Each stage includes a solid state active device, e.g., transistor of which the internal reactance varies responsive to variations of current therethrough. The gain of each stage is set at greater than unity to realize oscillatory conditions. The current through the active device varies responsive to a varying supply voltage. The transistor of each stage establishes a time lag due to the internal impedance characteristice in addition to the 180° lag due to the amplifying characteristics of the stage. As the magnitude of the current through the active device varies responsive to variations of the control voltage, the oscillatory frequency varies to retain the phase lag constant. The phase lag of each stage is adapted such that the overall phase shift of the input to the first stage relative to the output of the last stage is a multiple of 360°. As the control voltage is varied, the frequency of oscillation varies such that the phase shift remains constant for all frequencies and the overall phase shift of the system is a multiple of 360° for all frequencies of the band of operation. Accordingly, as the supply voltage is repeatedly varied through a select range of values, the oscillator continuously and repeatedly sweeps through the range of frequencies.

DESCRIPTION OF PREFERRED EMBODIMENTS

Figure 1:
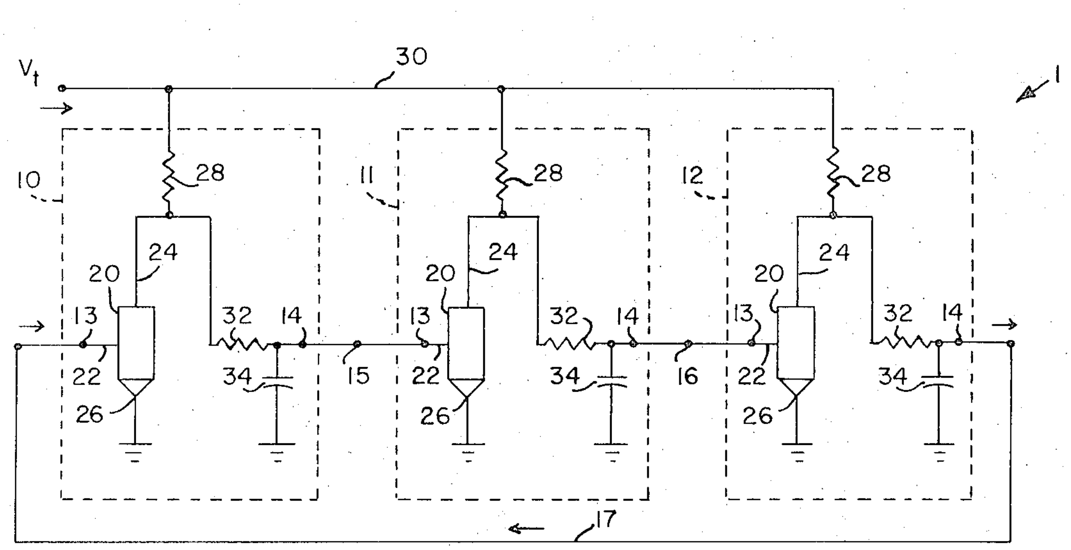
FIG. 1 is a circuit and block diagram of an oscillator of the present invention.

Referring to the drawings, FIG. 1 illustrates a circuit diagram of a voltage controlled sweep oscillator, referred to by the general reference character 1 and incorporating the teachings of the present invention. The oscillator is in the form of a triple-lag oscillator including three amplifier-phase shift stages 10, 11 and 12 joined in cascade. Internally each of the stages 10, 11 and 12 are equivalent with an input terminal 13 and an output terminal 14. The stages are joined in cascade with the output of the stage 10 joined to the input of the stage 11 joined at a node 15, and the output of the stage 11 joined to the input of the stage 12 at a node 16. Feedback from the output of the stage 12 to the input of the stage 10 is realized by a feedback line or node 17. Each stage 10, 11 and 12 includes a NPN transistor 20 having a base terminal 22, a collector terminal 24 and an emitter terminal 26. The emitter 26 is electrically tied to ground. The collector terminal 24 is tied to a resistance 28 extending to a terminal 30. Thus, the collector-emitter circuit of the transistor 20 extends between the terminal 30 and ground potential reference such that current flow through the transistor is dependent on the difference in potential between the terminal 30 and ground reference. The terminal 30 is adapted to receive a control-supply voltage $V_t$. The voltage $V_t$ may originate with a ramp voltage generator such that the voltage $V_t$ repeatedly sweeps through a range of varying values.

The output from each stage is taken off the collector 24 of the transistor 20. The collector 24 is also tied to a resistance-capacitance network including a resistor 32 and a capacitor 34. The junction of the resistor 32 and the capacitor 34 is common to the output terminal 14. The other side of the capacitor 34 is tied to the ground reference. The base electrode 22 of each transistor 20 of the stages 11 and 12 are tied in common to the output of the preceding stage and the output of the stage 12 is tied to the base 22 of the stage 10 through the feedback line 17. The capacitor 34 of each stage 10, 11 and 12 is in parallel with the input capacitance of the proceeding stage 11, 12 and 10 respectively such that the capacitor 34 of each stage influences the input impedance of the following stage.

In operation voltage controlled sweep oscillators 1 structured according to the circuit of FIG. 1 have been found to oscillate in the frequency range of 2–20 MHZ with a variation of $V_t$ in the order of 1.0 – 1.5 volts and a high frequency transistor, e.g., 2N2222. The theory of oscillation is as follows. With a sine wave signal, e.g. waveform (*a*) of FIG. 2, at the input terminal 13 of the stage 10, the signal is amplified and shifted 180° by the amplifying action of the transistor 20. Assuming for purposes of description that the 180° phase shift is a lag, the internal characteristics of the transistor 20, the resistor 28, the resistor 32 and the capacitor 34 cause a further phase lag so that the total lag of the signal at the terminal 14 relative to the terminal 13 is greater than 180°, e.g., waveform (*c*) of FIG. 2. The total phase lag for stage 10 may be mathematically represented as $\theta = (180° + \alpha)$. A similar amplifying and phase shift occurs at each of the other stages 11 and 12. Thus, the total phase shift for the entire stages network equals $N(\theta) = N(180° + \alpha)$ where $N$ represents the total number of stages, $\theta$ the total phase shift for each stage and $\alpha$ the phase lag induced by the resistance-capacitance characteristics of each stage.

Figure 2:
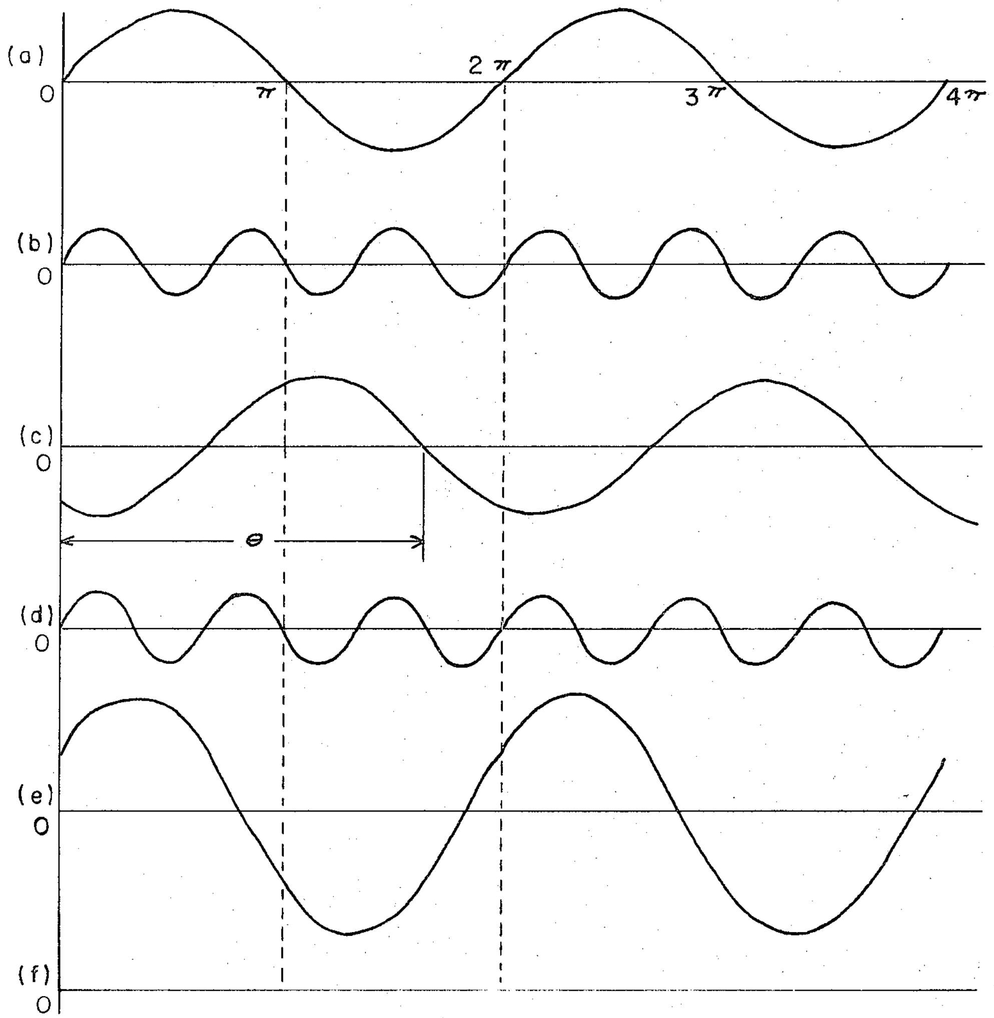
FIG. 2 is a wave shape diagram illustrating relative wave shapes at the input and output of each amplifier-phase shift stage of the oscillator of FIG. 1 and other oscillator embodiments herein described.

To realize oscillation, the total gain of the oscillator network 1 exceeds unity and the total phase lag $N(\theta)$ is a multiple of 360°. To realize gain exceeding unity, each stage 10, 11 and 12 is adapted to have greater than unity gain so that the net gain of the system exceeds unity. To realize the necessary phase shift, the phase shift of the oscillator 1 due to the amplifying action is (3 × 180°) or 540°. Simultaneously, the interaction within each stage of the transistor 20, the resistor 28, the resistor 32 and the capacitor 34 of each stage 10, 11 and 12 along the input capacitance and input resistance of the following stage, introduces a lag $\alpha$ of 60° per stage i.e., $\alpha = (180°/N) = 60°$, in addition to that of the amplifying action. Thus for the triplelag oscillator 1, the net lag for each stage individually is $(180 + \alpha)°$ or 240° and the net lag for the three-stage network is 720° or an integral multiple of 360°. The waveform of FIG. 2 ($a$) illustrates the input to the stage 10 which is also representative of the output of the stage 12 at the node 17. The output of the stage 10, as represented by the waveform of FIG. 2($c$) lags the input of stage 10 by 240°. Similarly, the stage 11 introduces a further lag of 240° and the stage 12 introduces a still further lag of 240° so that the output of the stage 12 is an integral multiple of 360° relative to the waveform ($a$). The feedback line 17 then provides positive feedback.

To realize sweep frequency operation, the control-supply voltage $V_t$ is varied. As the control-supply voltage $V_t$ varies, the current flow through the transistor 20 of each stage varies. The impedance characteristics of the transistors 20 and their bandwidth or ability to amplify high frequencies are affected by the current flow through them. Accordingly, as the voltage $V_t$ is varied, the operating point of the transistors 20 and the resonant frequency varies such that the oscillator 1 seeks a different oscillating frequency for each value of $V_t$. The frequency of oscillation of the network 1 increases as the voltage is increased and decreases as the voltage decreases. With the positive feedback, each stage 10, 11 and 12 automatically seeks out the frequency at which oscillation is sustained with changes of voltage $V_t$. Accordingly, as $V_t$ varies, the frequency automatically varies and the phase lag $\alpha$ remains constant. The resistor 32 also influences the value of current through the transistor 20 and the resonant frequency. The larger the size of the resistor 32, the smaller the amount of current and thereby the maximum frequency of oscillation is decreased.

The resistance 32 and shunt capacitance 34 of each stage 10, 11 and 12 forms a "low pass filter" and the harmonics of the generated signal are attenuated by the low impedance to ground of the capacitances. The attenuation of the high frequency signal components is further aided by the interelectrode capacitance of the transistors. Thus, the waveshape at the node 15 is substantially sinusoidal.

The number of amplifying-phase lag stages need not necessarily be three. The number of stages need be such that the total phase shift between the input to the network and the output of the network is a multiple of 360°. For example, the number of stages may be 5, 6, 7, 8 . . . . For an odd number of stages, the phase lag $\alpha$ per stage is $180°/N$ where $N$ represents the number of stages. For an even number of stages, the phase lag $\alpha$ per stage is $360°/N$. For an even number of stages, the DC level will not be self adjusting, so that one stage is necessarily A.C. decoupled. For odd number of stages, it has been found that the oscillator network is self adjusting such that if any stage tends to shift from the center of the operating point, the following stage forces operation towards the center point. In an A.C. sense, the oscillator adjusts itself until it finds a time lag causing the total to be a multiple of 360°.

Figure 3:
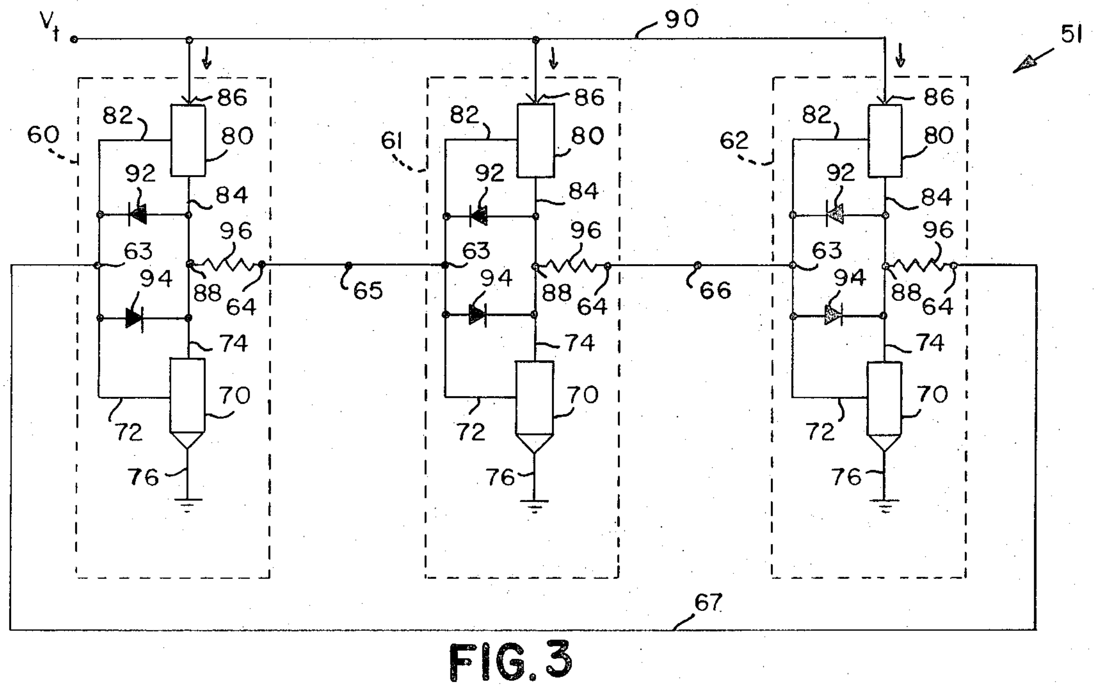
FIG. 3 is an alternative embodiment of an oscillator of the present invention.

FIG. 3 illustrates a further embodiment of a voltage controlled sweep oscillator of the present invention and referred to by the general reference character 51. The oscillator 51 includes three amplifier-phase shift stages 60, 61 and 62. Internally each of the stages 60, 61 and 62 are the same with an input terminal 63 and an output terminal 64. The stages are joined in cascade with the output of the stage 60 joined in common to the input of the stage 61 at a common node 65 and the output of the stage 61 joined in common to the input of the stage 62 at a common node 66. Feedback from the output of the stage 62 to the input of the stage 60 is realized by a feedback line or node 67.

Each of the stages 60, 61 and 62 includes an NPN transistor 70 with a base terminal 72, a collector 74 and an emitter 76. The emitter 76 is electrically tied to ground, the collector 74 is tied to a current control PNP transistor 80 having a base terminal 82, a collector terminal 84 and an emitter 86. The collector 84 is tied to the collector 74 of the transistor 70 at a common output junction 88. The emitter 86 is tied to a terminal 90 adapted to receive the control-supply voltage $V_t$. A unidirectional control device in the form of a diode 92 is tied between the base 82 and the collector 84 of the transistor 80 with the anode of the diode joined to the collector. In parallel with the diode 92 is a second unidirectional conducting device in the form of a diode 94 connected in opposite polarity. The output from the stage is taken from the collector 74 of the transistor 70 through a resistor 96 extending to the output terminal 64.

In operation the base current for the PNP transistor 80 flows into the input terminal 63. The transistor 80 provides circuit symmetry for each stage 60, 61 and 62 such that the signal at the terminal 88 is substantially free of even harmonics. The diodes 92 and 94 are adapted to control the A.C. signal swing between the base and collector to avoid the transistors 70 and 80 from entering into saturation and causing odd harmonic distortion in the signal at the terminal 88. The diodes 92 and 94 are adapted to turn "on" or enter conduction at a voltage lower than the base-to-collector "on" voltage of the transistors 70 and 80. For example, the transistors 70 and 80 may be silicon transistors with a conduction range of 0.6 to 0.7 volts. The transistors 70 and 80 for each stage may be in a common can with the collectors tied internally in common, e.g. 2N4854. Also, the transistors 70 and 80 may be two separate transistors, e.g. the transistor 70 may be 2N2222 and the transistor 80 may be 2N2907A. The diodes 92 and 94 may be germanium or Schottky diodes with connection voltages of 0.2 to 0.3 volts or 0.3 to 0.4 volts thereby preventing the transistor from going into saturation. Accordingly, the signal at the terminals 64, 65, 66 and 67 are substantially pure sinusoidal signals. It has been found that the oscillator of FIG. 3 will oscillate over a frequency range of 10:1 as the supply voltage $V_t$ varies over values of 1.0 to 1.4 volts.

In some instances with laboratory models it has been found that with high voltages beyond 1.4 volts that the frequency of operation commenced to decrease. However, when the supply voltage was decreased back to the selected range of operation the frequency returned to normal operation.

Figure 4:
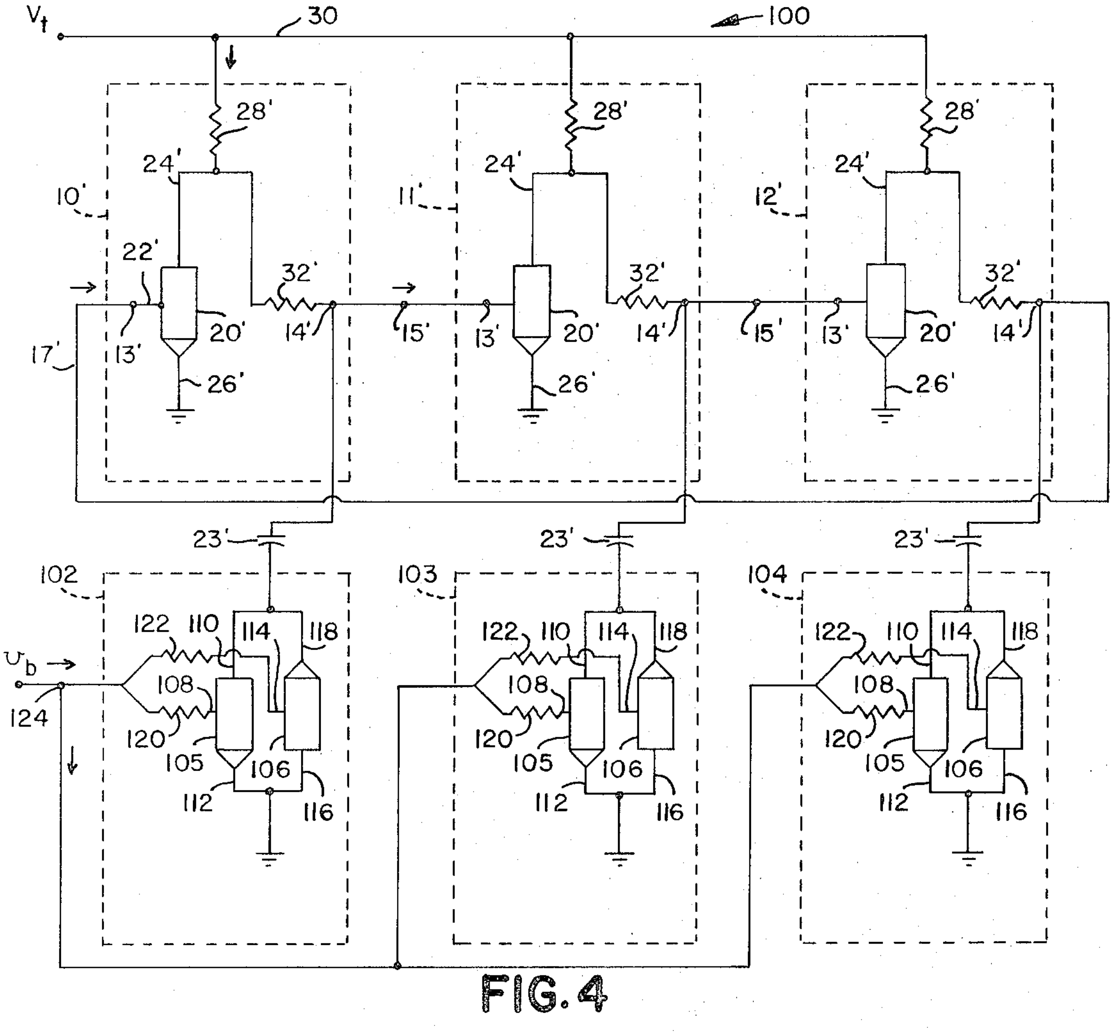
FIG. 4 is a further embodiment of an oscillator of the present invention.

FIG. 4 illustrates an alternative embodiment, referred to by the general reference character 100, of an oscillator of the present invention. The oscillator 100 provides an oscillation network which may be structured with NPN transistors thereby making it readily integratable using integrated circuit technology. The components similar to those of FIG. 1 carry the same reference numeral distinguished by a prime designation. The individual networks 10', 11' and 12' are similar to the networks 10, 11 and 12 of FIG. 1 except that the path of the by-pass capacitor 23' to ground is through a control circuit. In the network 100 the ground path of each of the capacitors 23' of each stage 10', 11' and 12' is through an extension control network 102, 103 and 104 respectively. The networks 102, 103 and 104 are similar in structure relative to one another and each is adapted to control the effect of the capacitor 23' which in turn effects the frequency range of operation. The capacitor 23' may be partially in, fully in or fully out responsive to the conductive state of the extension networks 102, 103 and 104. The networks 102, 103 and 104 each include a pair of control gates in the form of NPN transistors 105 and 106 to control current in both directions through the capacitor 23'. The transistor 105 includes a base 108, a collector 110 and an emitter 112. The transistor 106 includes a base 114, a collector 116 and an emitter 118. The emitter 112 of the transistor 105 and the collector 116 of the transistor 106 are tied in common to ground reference. The collector 110 of the transistor 105 and the emitter 118 of the transistor 106 are tied in common to the capacitor 23'. The base electrode 108 of the transistor 105 is tied to a resistor 120 and the base electrode 114 of the transistor 106 is tied to a resistor 122. The resistors 120 and 122 are tied to a junction 124 which is common to the input of each of the other extension networks 103 and 104. A variable supply potential $V_b$ is applied at the terminal 124 to control the conduction of the transistors 105 and 106. With the variable supply potential $V_b$ at a low value, the transistors 105 and 106 do not conduct and the capacitor 23' is effectively not in the circuit and the oscillator oscillates at a high frequency. As $V_b$ rises in value, base current flows and the transistors 105 and 106 conduct. For intermediate values of $V_b$, intermediate values of conduction can occur and the frequency of oscillation of the oscillator 100 will have intermediate values. Proper selection of the value of the capacitor 23' relative to the stray capacitance, permits a large variation in frequency through the joint control of $V_t$ and $V_b$.

In operation, the oscillator 100 will oscillate at wide frequency ranges without the control stages 103 and 104. However, with the stages 103 and 104, it has been found that a more symmetrical sine wave is realized. Further, the wide frequency variation is realized with either transistor 105 or 106 in the absence of the other. Both transistors 105 and 106 are high frequency transistors, e.g. 2N2222. However, with both transistors 105 and 106, it has been found that a more sinusoidal shape is realized.

Figure 5:
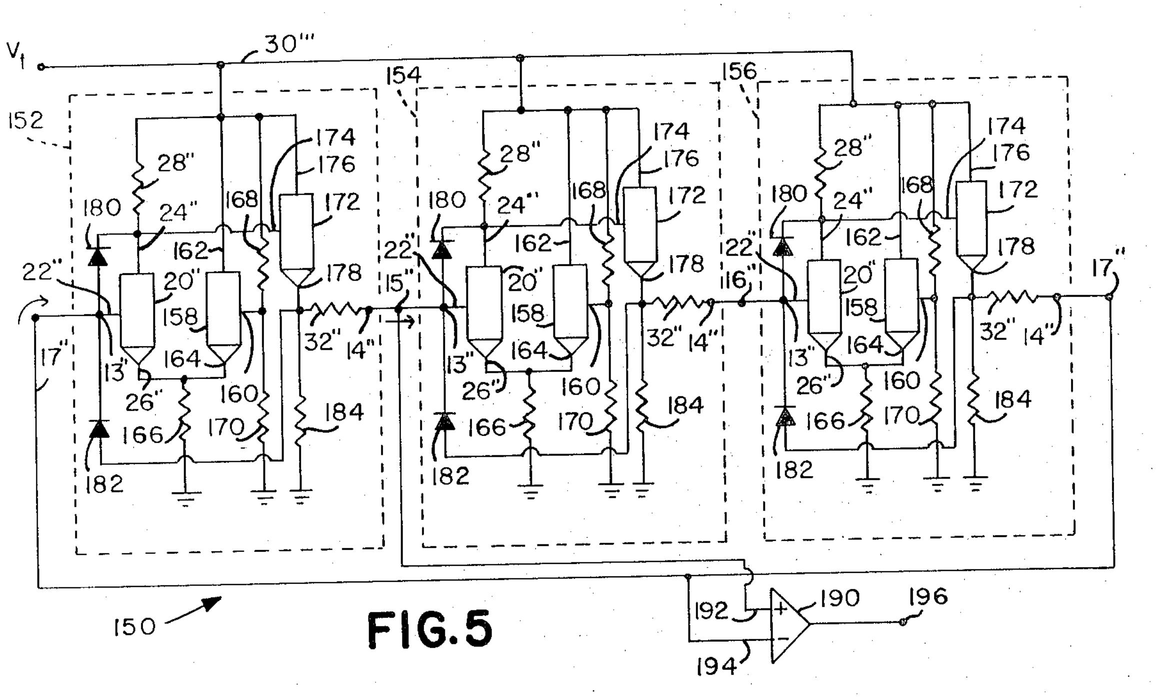
FIG. 5 is a further embodiment of an oscillator of the present invention.

FIG. 5 illustrates a further embodiment of an oscillator of the present invention and referred to by the general reference character 150. Those components of the oscillator 150 similar to the oscillator 1 carry the same reference numeral distinguished by a double prime designation. The oscillator 150 is adapted to provide a circuit which can be readily integrated on a single chip using all NPN transistors. Heretofore it has frequently been found that PNP transistors used in the integration process have high frequency limitations relative to that of NPN transistors. Accordingly, for integration and high frequency operation, NPN transistors may be preferable.

The network 150 provides a series of three amplifier-phase shift stages 152, 154 and 156 each operating in a differential mode and including a differential stage formed by the NPN transistors 20'' and a NPN transistor 158. The transistor 158 has a base electrode 160, a collector 162 and an emitter 164. A common emitter resistor 166 couples the two transistors 20'' and 158 and extends to ground reference. A base voltage is established for the transistor 158 by means of a voltage divider including a pair of resistors 168 and 170. The resistor 168 extends from the base of the transistor 158 to the terminal 30'' to receive the control-supply voltage $V_t$ and the resistor 170 extends to ground reference.

An emitter follower is tied in series with the output of each transistor 20'' and the input to the proceeding stage. Each emitter follower includes a transistor 172 with a base electrode 174, a collector 176 and an emitter 178 is included. The base 174 and the collector 24' extend to the base of the transistor 20'' through a diode 180. The emitter 178 extends to the base 22'' through a diode 182. The diodes 180 and 182 may be relatively low "on" voltage semiconductors designed to prevent saturation non-linearity thereby reducing the tendency of establishing third harmonic distortion in the output signal of each stage. An emitter return resistor 184 extends from the emitter 178 and the resistor 32'' to ground reference.

In operation the emitter follower transistor 172 takes the output from the collector of the transistor 20''. The transistor 158 operates at a constant D.C. level with the base tied to the voltage divider between $V_t$ and ground reference. The transistor 158 provides emitter current control of the transistor 20''. The differential action of the two transistors 20'' and 158 makes each stage self compensating such that as the transistor 20'' goes on, the transistor 158 goes off and linearizes the collector response relative to the base. This has been found to result in more linear operation and reduce second harmonic distortion. The emitter follower transistor 172 serves to restore the D.C. level of the associated stage and to provide low output impedance to the following stage.

Operation of FIG. 5 may be further explained with reference to the fundamental circuit of FIG. 1 from which FIG. 5 derives. It may be noted that the basic nomenclature of the components of the phase-amplifier stages of FIGS. 1 and 5 is consistent, i.e., the transistor of central internal interest of each amplifierphase shift stage is designated 20; the output nodes are designated 14; the input nodes are designated 15, 16, 17; collector and output resistors are designated 28 and 32; and the transistor emitter is designated 26. The basic phase relationships and basic objectives are similar for FIGS. 1 and 5.

In deriving FIG. 5, elements are added to FIG. 1 for the following reasons. As previously discussed, the basic functioning of the circuit of FIG. 1 provides a phase shift of (180° + $\alpha$) where $\alpha$ is 60° if the number of amplifier-phase shift stages is 3. The value of $\alpha$ is established by the natural lag of the transistor amplifier and its associated parts including resistor 32 and capacitor 34 at high frequencies. Sweep oscillators of circuitry of FIG. 1 may have a non-linearity, which in many applications may become undesirable if there is a desire to avoid harmonics. The non-linearity in a stage may be due in part to loading of the following stage whose base-to-emitter junction is like that of a diode known to have a logarithmic non-linearity. As a result the signal at the input nodes 15, 16 and 17 may be an imperfect sinusoid due to the loading. This loading is avoided in FIG. 5 by inserting in each stage the emitter follower 172 between the transistor 20 of that stage and the transistor 20 of the following stage. This eliminates one source of distortion. However, the insertion of the emitter-follower in turn requires a negative supply to make the1emitter follower function properly. To realize this, the entire circuit is raised in d.c. level by operating the transistor 20'' at an elevated d.c. voltage when the emitter is raised by resistor 166. At the same time, this step has the disadvantage of reducing the gain of each stage. To recover the loss of gain, transistor 158 is added and is biased with resistors 168 and 170. Its current is the a.c. complement of that of resistor 20''. Now transistor 20'' has near normal gain. The result is an oscillator needing only one supply voltage and moore free of distortion than that of FIG. 1. Diodes 180 and 182 act to limit the size of th swing, thus avoiding non-linearities due to saturation an cutting off, as heretofore described.

The oscillator 150 further includes a differential amplifier 190 for coupling the output. The amplifier 190 has a pair of input terminals 192 and 194 and an output terminal 196. The two input terminals 192 and 194 may be connected to any two of the three nodes 15'', 16'' and 17'' such that the output of the amplifier 190 is the amplified difference between two inputs. The phase difference of the fundamental frequency between any two nodes of the nodes 15'', 16'' and 17'' is 240°. The phase difference between the third harmonic of the signal at any of the three nodes 15'', 16'' and 17'' is zero and the differential action of the differential amplifier 190 cancels the third harmonic. In FIG. 5 the differential amplifier is connected to the nodes 15'' and 17''. Wave-forms (*a*) and (*c*) represent the two input fundamental signals at the input terminals 194 and 192 to the amplifier 190. Waveforms (*b*) and (*d*) represent the third harmonic signals at the input terminals 194 and 192 to the amplifier 190. Waveform (*e*) represents the output of the amplifier 190 which is the difference between the fundamental signals. Waveform (*f*), which represents the output of the third harmonic, illustrates how the third harmonic is cancelled. This principle of third harmonic cancellation is similarly applicable to the circuits of FIG. 1 and FIG. 3. The symmetry of the individual stages 152, 154 and 156 cancels the even harmonics. Accordingly, the most noticeable remaining harmonic is the fifth. However, the low pass nature of each stage substantially cancels out the fifth harmonic. As such, the output taken at the terminal 196 is a sine wave at the fundamental frequency as illustrated by the waveform (*e*) of FIG. 2.

Figure 6:
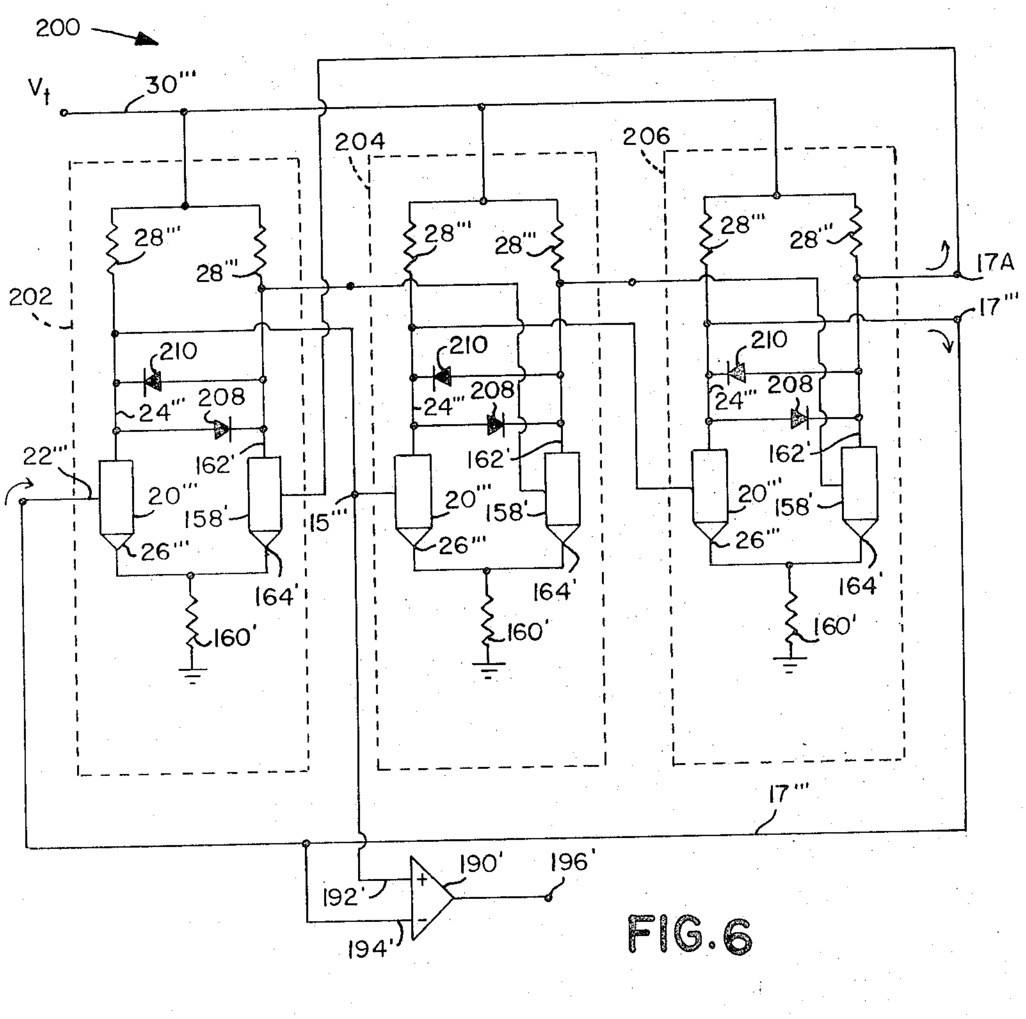
FIG. 6 is a further embodiment of an oscillator of the present invention.

FIG. 6 illustrates a further embodiment of a voltage controlled oscillator referred to by the general reference character 200. The network 200 is an alternative embodiment from that of FIG. 5. The network 200 is adapted for the use of all NPN transistors, provide a symmetrical form to cancel even harmonics and include differentiating to cancel the third harmonic. The oscillator network has three amplifying-phase shift stages 202, 204 and 206. Each stage includes various components similar to preceding embodiments and carry the same reference numeral distinguished by further prime designations. To realize the symmetrical operation and non-saturation within each stage, the collectors of the transistors 20''' and 158' are interconnected by a pair of diodes 208 and 210, tied in parallel and in opposite polarities. Each of the transistors 20''' and 158' of the stage 202 receives feedback at its base electrode. The base of each transistor 20''' of each stage 202, 204 and 206 is tied to the collector of the transistor 20''' of the preceding stage and the base of each transistor 158' of each stage 202, 204 and 206 is tied to the collector of the transistor 158' of the preceding stage. As such the transistors 20''' and 158' of each stage conduct on alternate phases. The output from each transistor 20''' is taken off the collector and fed to the base of the transistor 20''' of the following stage of the cascade this transfer of signal from collector-to-base from transistor 20''' of the following stage is equivalent to that of the embodiment of FIG. 1. The output from each transistor 158' is taken off the collector and fed to the base of the transistor 158' of the following stage of the cascade. This take-off is equivalent to the take-off and feed of the embodiment of FIG. 1, with the difference being that this circuit is out of phase with the conditions of the transistor 20''' in the usual differential manner and serves only to reinforce the tendency of the oscillator to oscillate, while at the same time providing circuit symmetry and elimination of distortion in the usual manner of a differential amplifier. Feedback to the base of transistor 158' of stage 202 is realized through a feedback line or node 17A extending from the collector of the transistor 158' of stage 206. The feedback signal on the line 17A is of opposite phase to that of the signal on the feedback line 17'''.

What is claimed is:

1. A sweep oscillator comprising in combination:

a first terminal means for receiving a variable control potential;

a plurality of individual amplifier-phase shift stages connected in cascade in which the amplification gain of each stage is at least unity, each of said stages being adapted to amplify an input signal and generate an output signal (180 + $\alpha$)° out of phase relative to the input to said stage wherein $\alpha$ represents a phase shift induced by the internal characteristics of said stage, each of said stages including an amplifier transistor of which the internal reactance varies responsive to current therethrough, each of said amplifier transistors having a base, collector and emitter electrode, the base electrode of each amplifier transistor extending between the first terminal means and a reference potential, a resistor element tied in series with said collector-emitter circuit of each of said transistors and said terminal means whereby the maximum current of said amplifier transistor may be controlled and the maximum frequency of operation controlled, the number of amplifier-phase shift stages connected in cascade being selected such that the output signal of the last stage is out of phase with respect to the input of the first stage by a multiple of 360°, each stage further including a resistance-capacitance filter means with a resistance element engaged at the output of each amplifier stage and extending to the input of the following amplifier stage and a by-pass capacitance extending from said resistance element to the reference potential;

at least one extension stage engaged in series with said by-pass capacitance and the reference potential of at least one stage for controlling current conduction through said by-pass capacitor, the extension stage including a solid state control gate extending intermediate said by-pass capacitor and said reference potential to control current conduction through said by-pass capacitor, said control gate further extending to a second terminal means for receiving a variable supply potential for controlling conduction of said control gate responsive to the variable supply potential; and feedback means for returning an output signal from the last stage of the cascade to the input of the first stage of the cascade.

2. The sweep oscillator of claim 1 wherein the extension stage includes a pair of solid state control gates of opposite polarity and joined in parallel relative to one another to establish a bidirectional current control through said by-pass capacitor, each of said control gates of said pair of gates extending to said second terminal means for receiving the variable supply potential.

3. The sweep oscillator of claim 1 including a plurality of said extension stages, each of said extension stages being engaged in series with one of said by-pass capacitances for controlling current conduction through said engaged capacitor and each of said solid state control gates extending to said second terminal means.

4. The sweep oscillator of claim 3 wherein each of said extension stages includes a pair of solid state control gates of opposite polarity and joined in parallel relative to one another to establish the emitter bidirectional current control through the by-pass capacitor of each stage, each of said control gates of each extension stage extending to said second terminal means for receiving the variable supply potential. more the and

5. The sweep oscillator of claim 4 in which the amplifier transistors of each stage are NPN transistors and the control gates of each of the extension stages is an NPN transistor.

* * * * *